(12) United States Patent
De La Quintana

(10) Patent No.: US 7,310,583 B2
(45) Date of Patent: Dec. 18, 2007

(54) SYSTEM AND METHOD OF MEASUREMENT AND PROCESSING OF ELECTRICAL VARIABLES

(75) Inventor: Alfredo De La Quintana, Santiago (CL)

(73) Assignee: Conecta S.A. (CL)

( * ) Notice: Subject to any disclaimer, the term of this patent is extended or adjusted under 35 U.S.C. 154(b) by 0 days.

(21) Appl. No.: 11/052,038

(22) Filed: Feb. 8, 2005

(65) Prior Publication Data

US 2005/0216219 A1    Sep. 29, 2005

(30) Foreign Application Priority Data

Mar. 10, 2004  (CL) .................................. 479-2004

(51) Int. Cl.
*G01R 25/00* (2006.01)

(52) U.S. Cl. .................... 702/65; 702/127; 702/188; 710/100; 710/305; 710/306; 710/314; 717/124; 717/107; 717/149; 717/106; 700/245

(58) Field of Classification Search ................. 702/65, 702/127, 188; 700/245; 710/305–306
See application file for complete search history.

(56) References Cited

U.S. PATENT DOCUMENTS 6,556,003 B2    4/2003    Choi
6,823,283 B2 *  11/2004   Steger et al. ............... 702/127

* cited by examiner

*Primary Examiner*—John E. Barlow, Jr.
*Assistant Examiner*—Sujoy Kundu
(74) *Attorney, Agent, or Firm*—Banner & Witcoff, Ltd.

(57) ABSTRACT

A system and method of measurement and processing of physical variables, and in particular electrical variables, comprising: a multimeter to measure multiple electrical variables, similar to any conventional multimeter; a microcomputer capable of the numerical processing of variables, storage and communication; a conventional computer that can read magnetic or optical storage media, or alternately, be connected to the Internet; an Internet website of public access to users of said multimeter; an Internet server which runs mathematical processing software to carry out graphical and numerical analysis.

9 Claims, 5 Drawing Sheets

CONVENTIONAL MULTIMETER + CPU DATA MEMORY, PROGRAM MEMORY, COMMUNICATION PROTOCOLS AND PORTS = GRAPHICAL REPRESENTATION OF THE INVENTED MULTIMETER

SYSTEM AND METHOD OF MEASUREMENT AND PROCESSING OF ELECTRICAL VARIABLES

Applicants herewith claim the benefit of Chilean Patent Application No. 479-2004 filed Mar. 10, 2004.

FIELD OF THE INVENTION

The invention relates to a system and method of measurement and processing of physical variables in general, and in particular electrical variables, consisting of a portable or stationary electronic measuring device and/or recorder whose measuring functionality is downloaded through a personal computer (PC) from a web site on the Internet, plus a program or software for uploading the recorded data that can be used from a website on the Internet, plus a program or software that performs graphical and/or numerical analysis of the measured and/or recorded data which is available on a web site on the Internet and can be executed from this web site.

DESCRIPTION OF THE RELATED TECHNIQUE

At the present time a great variety of instruments exist that allow one to measure different physical parameters such as voltage, current, resistance, and frequency. These instruments are called multimeters or multitesters, and can be found in different versions and models ranging from the simplest to the most complex depending on the parameter that one desires to measure.

In general, voltage, current and electrical resistance are the possible parameters that one may measure using a conventional multimeter. Models that measure capacitance and inductance, and even test semiconductor elements such as transistors and diodes, are also available. On the other hand, and from a commercial point of view, the greater the precision, stability under adverse working conditions, capacity of processing and analysis of measured parameters, and number of inputs available for the measurement of diverse parameters, the higher the price.

Nevertheless, there are no three-phase multimeters (under the unified concept of hand-held portable devices, low cost and widespread use) that can measure the harmonic content of a voltage or a current signal (harmonics) and also measure transitory disturbances of voltage (outages, micro-outages and abrupt variations), slow oscillations of voltage (flicker), voltage unbalances in a three-phase power system (sequence voltages) and transitory voltage drops and increases (sags and swells).

Instruments that measure and record the all of the aforementioned variables do exist, but their conception is so sophisticated that, in general, they are cost-prohibitive (compared to a conventional multimeter that measures voltage, current and resistance) and require specialized personnel as much to measure the variables as to process the resulting data. This condition of sophistication and specialization, in addition to the high cost, prohibits their widespread use in industrial and commercial plants.

The latter instruments are excluded from categorization as multimeters (even though they are multimeters in the strict sense of the word) and, in general, are called electric network analyzers.

As the degree of measurement sophistication and specialization of the instruments and the degree of complexity of the programs necessary for the processing of the data increase, the price increases too, and in addition, highly trained specialists are required for the efficient use of these instruments and programs, all of which represents one of the problems of the instruments available in the market at the moment.

The most closely-related patented prior art is found in U.S. Pat. No. 6,556,003, which describes a "Computer Multimeter". This apparatus comprises some existing computer devices (such as input and output devices, microprocessor and memory) and specific multimeter circuits, all of which gives it a greater capacity than other multimeters. For example, it can provide numerical values, messages, tables and graphical representations of the measured parameters.

The aforementioned patent does not describe a low cost multimeter that allows selecting different measurement functionalities and generating graphical and/or numerical reports of the results. In addition, the high cost and the need for highly trained personnel inhibits the widespread use of a PC loaded with specialized software.

Currently in the market today one may find multimeters that offer many of the features of the invented multimeter and system. Typical features of high end multimeters include data storage registers, communications ports through which commands are sent to multimeters for execution and through which data is uploaded to PCs for analysis, and advanced programs and analysis which are factory-installed on multimeters. Some multimeter manufacturers offer PC-based data analysis software in order to perform numerical and graphical processing of the data registered by the multimeter. Fluke systems is one provider of such multimeters and data analysis software. However none of these multimeters or accompanying software exhibit capabilities of downloading programs to the multimeter or creating new programs for specific measurement functionality, or of a virtual community of users with public access to programs, processing and information.

The following additional prior art discussion is provided for devices that would not be considered to be multimeters:

Dranetz BMI maintains a website for the users of their instruments and provides information which eventually helps to identify and resolve problems in industrial plants. However, features of the present invention such as automatic data processing and a virtual community of users who share their experiences are not provided. Furthermore the measurement functionalities of the instruments are fixed and can not be changed through the loading of programs from a PC or the Internet, unlike the present invention.

DLI Engineering provides an automatic system of analysis and diagnostics through the Internet, primarily providing mechanical and vibration analysis. They have developed a concept based on an instrument called "Sprite" that is capable of registering data, and on an Internet website through which one can perform basic data analysis. The user does not have the ability to customize the analyses performed, and there is no associated virtual community of users who share their experiences. The instruments are PCs equipped with data acquisition cards. This prior art does not comprise the same concepts of a low cost multimeter that allows the downloading of different measurement functionalities from a PC or the Internet, generation of user-specified graphical and/or numerical reports of the results, nor of a virtual community of users as exhibited in the present invention.

Test and Measurement equipment which is more advanced than typical multimeters (i.e. signal, spectrum or network analyzers) commonly provides features such as program storage capacity, custom program creation, and increasingly provides data processing on the same instrument. Anritsu's "Signature" signal analyzer is one such example. These PC-based platforms do not exhibit the concepts of low cost, simplicity of use by average technicians, nor of the virtual communities of users exhibited by the present invention.

SUMMARY OF THE INVENTION

The invention is an electronic multimeter which, by utilizing a single measuring device or hardware, simultaneously or sequentially measures different electrical variables and stores them in memory. The measuring functions that the multimeter is able to execute are loaded from a website, a CD or another storage media provided with the multimeter.

In the preferred embodiment the programs, resident on web sites or in the storage media and provided to enable the multimeter to perform different measurements, are for public use and access. Furthermore, as an open system, any person or institution in any part of the world can develop new programs for the multimeter and make them available for public use, with no restrictions or cost, through Internet web sites.

A great advantage presented by this invention in its preferred embodiment is that any person in the world can, for example in his own industrial plant, measure, identify and solve a specific problem with his own custom problem-solving procedure, and make his process of identification and resolution of this specific problem available to other multimeter users in the rest of the world. The user of a multimeter can download any measurement functionality available on a website by connecting the multimeter to any PC that has an Internet connection.

The data recorded by each multimeter will be processed and converted into useful information. Calculations, determination of new compound variables (i.e. $P_1=P_1+P_2+P_3$), numerical and graphical reports, and all other types of analyses and reports will be executed through programs furnished in the storage media. Data processing programs and/or software are either provided with the multimeter or downloaded from an Internet website, and in the preferred embodiment these programs are provided free of charge In order to use the data processing software, the user will connect his multimeter to any PC connected to Internet and upload the data measured and stored by the multimeter to the website provided for such effects.

The reports and processes requested by the user are automatically generated and are for the exclusive use of each multimeter user. This information will not be available to any other user unless the original user makes it available for public use and diffusion.

The data processing server includes a computer operating a mathematical program, such as Matlab WebServer or other general or special-purpose computational programs, which is specifically designed for mathematical or graphical processing of any type of variable.

Therefore, as a consequence of the explanation provided above, the objectives of the present invention are:

To provide a new system or application for measuring, recording and processing physical variables through the application of next generation technologies.

To make common the measurement of specific electrical variables whose measurement is considered highly sophisticated today.

To permit the measurement and analysis of sophisticated electrical variables without the need for specialized technical personnel.

To provide a measuring instrument with a potential for independent growth, in its problem-solving capacity, enabled by the development of programs and/or software developed by any person in the world.

To permit, if the use of this invention becomes widespread and each industrial plant that uses the multimeter shares its experiences, these industrial plants and all who usufruct of this knowledge to reach a higher level of productivity.

To provide a system and method of measurement and processing of physical variables with a significantly lower cost than the prior art.

BRIEF DESCRIPTION OF THE FIGURES

The following figures describe schematically the preferred embodiment of the present invention. The figures have an explanatory character. Their purpose is to facilitate the understanding of the features of the invented measuring system, and they must not be necessarily considered as the only embodiment of the invention nor of the definitive system.

DETAILED DESCRIPTION OF THE INVENTION

Figure 1:
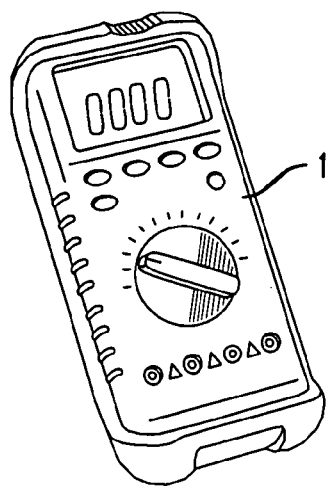
FIG. 1 is a representation of a conventional multimeter.

In order to improve or optimize the productive processes of industrial and commercial plants, it is necessary to solve operational and production-related problems. These problems are related to the existence of transitory electrical phenomena such as abrupt voltages drops or micro-outages, and the appearance of other electrical variables which are hard to measure and record, such as harmonics, unbalances and flicker.

In order to solve these problems, it is necessary to measure and store these variables for their later analysis in order to determine the origin of the problems and their solutions.

In addition, it is necessary to know and to measure basic variables that, after mathematical processing, allow the generation and determination of the additional information needed to find the problem, specify a solution, obtain the maximum productivity for the industrial and commercial plants, and administer them efficiently.

To accomplish this objective, people or companies interested in knowing the state (measured) and evolution (historical record) of these electrical variables (mainly voltage and current), and who have sufficient economic resources, acquire very sophisticated and expensive measuring systems. These systems, once connected to the desired measurement points, obtain and store the required electrical variables. The often complex electrical variables that explain the phenomenon (such as harmonics, transitory, etc) might be determined later by means of analysis and computational process of the measured values by specialists, who are not necessarily personnel available in the same previously-mentioned plants.

The measuring instruments available in the market and suitable for executing these sophisticated measurements are of very high price and consequently they are practically inaccessible to the electrical departments of the industrial and commercial plants. This high price is the result of the high degree of specialization of the instruments and their necessary data-processing software. This software is installed in the measuring instrument and each user pays for it at the time of acquiring the instrument. On the other hand, the efficient use of these instruments and their programs requires technicians with a specialization level that is frequently nonexistent in the personnel of the aforementioned plants.

The data stored by these instruments are difficult to interpret and numerical processing is required to obtain information which would enable problem resolution or certification.

The proposed system and method of measurement, data storage and electrical variable analysis perform in a completely automatic, efficient and economic manner the aforementioned measuring process by means of an innovative integration of technologies available on the market today.

The invented multimeter is a high precision and low cost measuring device able to perform, sequentially or simultaneously, all types of measurements required by the industry by downloading these programs from the Internet, a CD or other storage media when each program is required for the problem that is being investigated.

The multimeter can be conceived of in two forms:

The first form includes a conventional multimeter equipped with an additional CPU and memory. These elements are necessary to perform additional recording, processing and communication functions.

The second form consists of a single measuring device comprised by one or more CPUs, and not an instrument equipped with additional accessories as in the previous case.

In order to load the functionality or the required measurement type into the multimeter, it is necessary to connect it to a PC through its communication port. If the PC is not connected to Internet, the programs will be loaded in the multimeter from a storage media (i.e. a CD) that contains the necessary programs. If the PC is connected to the Internet, the user will be able to download a measurement functionality from an Internet website.

Then, the user can disconnect his multimeter from the PC and perform the measurement and data storage of variables in the industrial plant, according to the functionality loaded into the multimeter.

Once the measurement process is finished, the user will be able to post-process these data with programs provided on the CD or other storage media, or with programs resident in a website on the Internet.

The reports and processes requested by the user are automatically generated, are for the exclusive use by each respective multimeter user and they will not be available to any other user unless the original user arranges their public use and diffusion.

Since the mathematical processing tools resident in a website on the Internet are developed using standard programming languages and are of open access, any person, whether a multimeter user or not, would be able to generate and to submit programs for use by any other person.

System Components

A conventional measuring platform, similar to any other multimeter commercially available today.

A measuring platform specifically developed to perform the same functionalities of a conventional multimeter plus the new functionalities specified in this document.

A microcomputer capable of performing numerical processing of variables, data storage and communication with other devices.

An Internet site of public access for multimeter users to download different measurement types (functionalities).

An Internet site of public access for multimeter users to numerically and graphically process the data registered by a multimeter.

An Internet server equipped with mathematical processing software needed to generate graphical and numerical reports.

This invention can be applied to the measurement of electrical variables of any electrical network of any plant, whether it be industrial or commercial, or providing generation, transmission or distribution of energy, in the same way in which a conventional multimeter is used for the simple analysis of electrical phenomena today. The multimeter will be used in the analysis of more complex electrical phenomena whose existence today is diminishing the productivity of the plants.

The present invention extends itself to any application that requires the monitoring, data storage and post-processing of any physical variable, just by replacing the transducer of the monitoring unit with a transducer adapted to the type of variable that is desired to measure (flow, pressure, temperature, etc. or a combination of these variables).

On the other hand, the following advantages must be emphasized:

In the first place, the measuring platform or multimeter accepts the loading and execution of any program developed for the multimeter, thus, the development of measuring programs is limited only by the creativity of their programmers.

Secondly, the intelligence and capacity needed to generate graphical and/or numerical reports resides in an Internet site and may be used and reused as desired by multimeter users.

Thirdly, the development and sharing of programs that make possible the widespread and efficient use of the multimeter are left to the the disposition of the users and whomever else desires to participate.

The following description pertains to the measuring and processing of data performed by the system previously described.

A multimeter is made available which has the ability to measure and store instantaneous values of electrical variables and to recover these values by means of some of the functionalities loaded in the program memory of the multimeter.

The measurement functionalities are programs that will be provided in a storage media and also will be available in an Internet site of public access for the users of the multimeter.

When activating the measuring functionality which has been selected and loaded into the multimeter, new data is generated and registered as a product of the measurement. These data will be transferred later to a PC for their numerical and/or graphical processing by programs installed in an Internet server.

Users at their own will can use the information and results thus generated. They are allowed to share this information by submitting it to the website provided for such purposes.

In summary, the measurement procedure goes as follows:

The user selects the electrical variable that he/she desires to measure with the multimeter.

The multimeter is connected to a PC though the communication cable provided and the communication port available in this PC.

Then, the user chooses the measurement functionality from the storage media or Internet site provided for such purposes.

The user downloads the selected measuring functionality to the multimeter.

Through an appropriate computer interface (Human Machine Interface), the user configures the specific parameters desired for measurement; such as sampling frequency, pre and post fault memory, maximum and minimum trigger levels, name of the plant, etc., and in general, variables that define the conditions under which the measurements will be performed.

The user disconnects the multimeter from the PC, connects the multimeter input probes to the device being tested and activates the measurement functionality with which the multimeter begins to measure and register data, according to the selected functionality.

When the measurement has finished, minutes, hours or days after being initiated, the user removes the multimeter from the measuring point, connects it back to the PC and uploads to the PC the measured values, that is to say, the data acquired during the measuring process is transferred from the multimeter memory to the PC and/or to the Internet.

Then the stage of processing the collected data begins. Graphical or more complex numerical processing can be chosen. These processes are made available on an internet web server provided for such purposes, and take place on this server. In the graphical process, a complete set of user defined of graphs is generated, whose format (line, bar, pie, etc) is defined by the user. In the numerical process, the data is processed and converted into new data sets that reflect the chosen processes, such as statistical analyses, correlations, maximums and minimums, etc. Results obtained from the graphical or mathematical processes can be copied and used by the user, who in addition can decide to share the data registered by his multimeter and/or to share the graphical and/or numerical results of his processes. For this purpose, an appropriated method to share the relevant information is set. Any multimeter user who chooses to may share his data through same Internet site, which provides the processing and usage of other resources on the site for public access. In addition, an information exchange application will be provided on the website, so the users will be able to post their questions and get them answered by other multimeter users, an administrator of the system or technical experts associated with the system.

Finally, the user can select the way to download the processed data, which could be through saving a file on the same computer or to a removable unit in ASCII, CSV or any other standard format.

APPLICATION EXAMPLE

We explain the present invention, based upon the attached figures.

Figure 2:
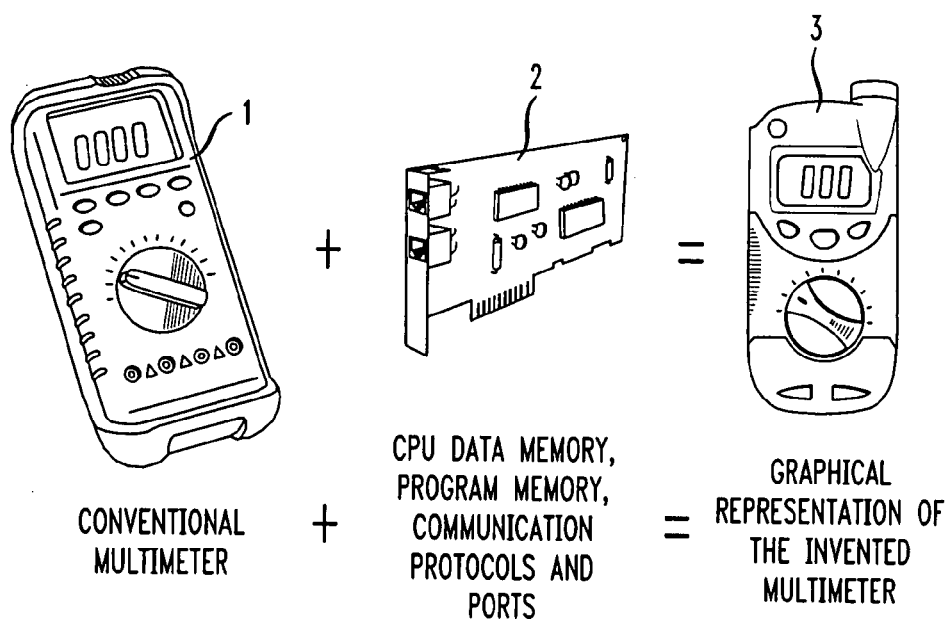
FIG. 2 represents the multimeter concept of the present invention.
Figure 3:
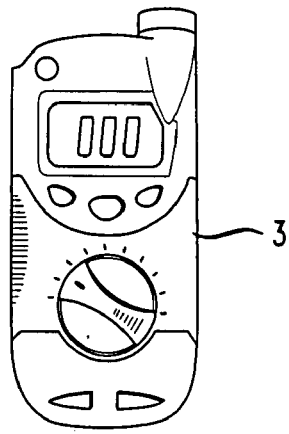
FIG. 3 is a graphical representation of the invented multimeter.

Making reference to FIGS. 1 to 3, a circuit board (2) with elements such as a CPU, data memory, program memory, communication protocols and ports, has been added to the tester (1).

By means of the union of the tester (1) with the circuit board (2), a portable measuring and recording instrument is created (3).

Figure 4:
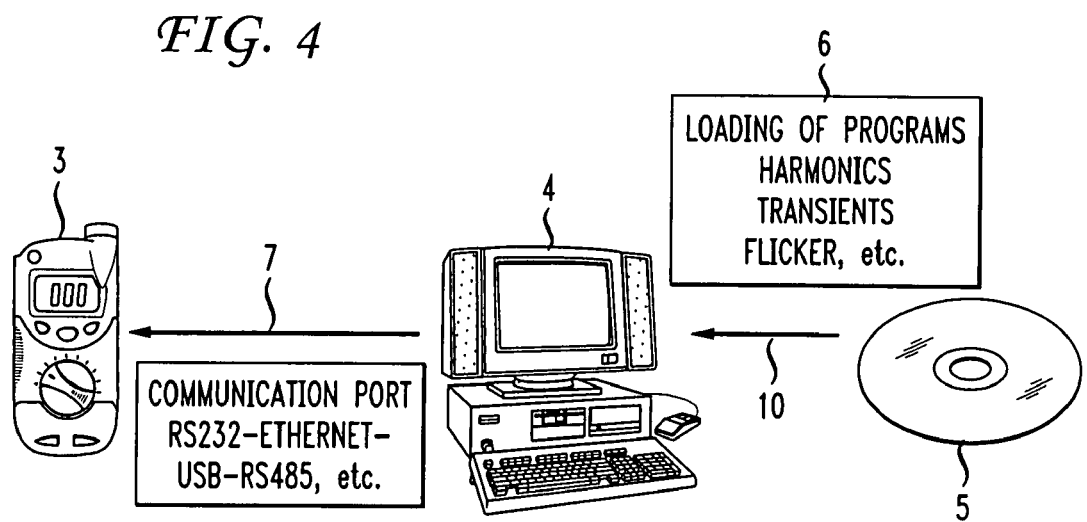
FIG. 4 is an explanatory diagram of the feature which allows the loading of programs from the storage media provided with the multimeter through the use of a computer.

FIG. 4, shows how functionality programs (6) such as harmonics, transients, flicker etc. are loaded from a CD-ROM (5) inserted in a computer (4).

Through a communication port (7) (RS232, Ethernet; USB; RS485, etc.) the programs (6) are loaded in the measuring and recording instrument (3).

Figure 5:
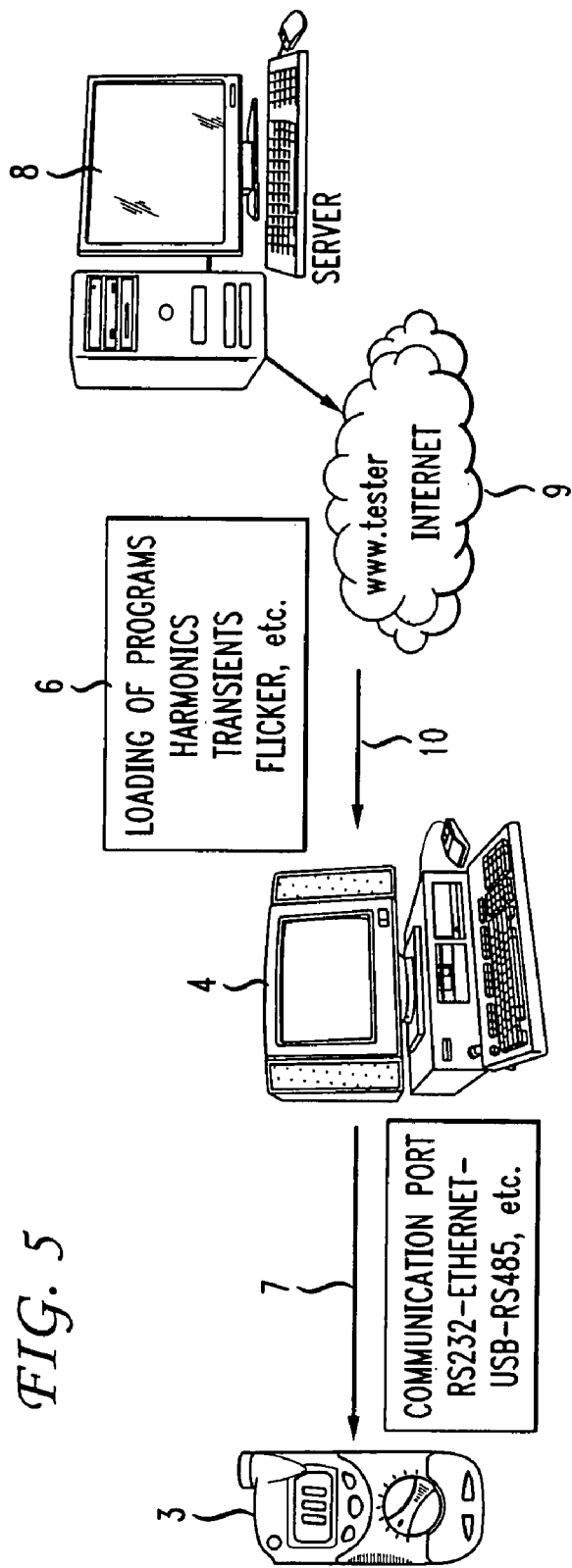
FIG. 5 is an explanatory diagram of the feature which allows the loading of programs from an website which is intended for use with the measuring system, through the use of a computer.
Figure 6:
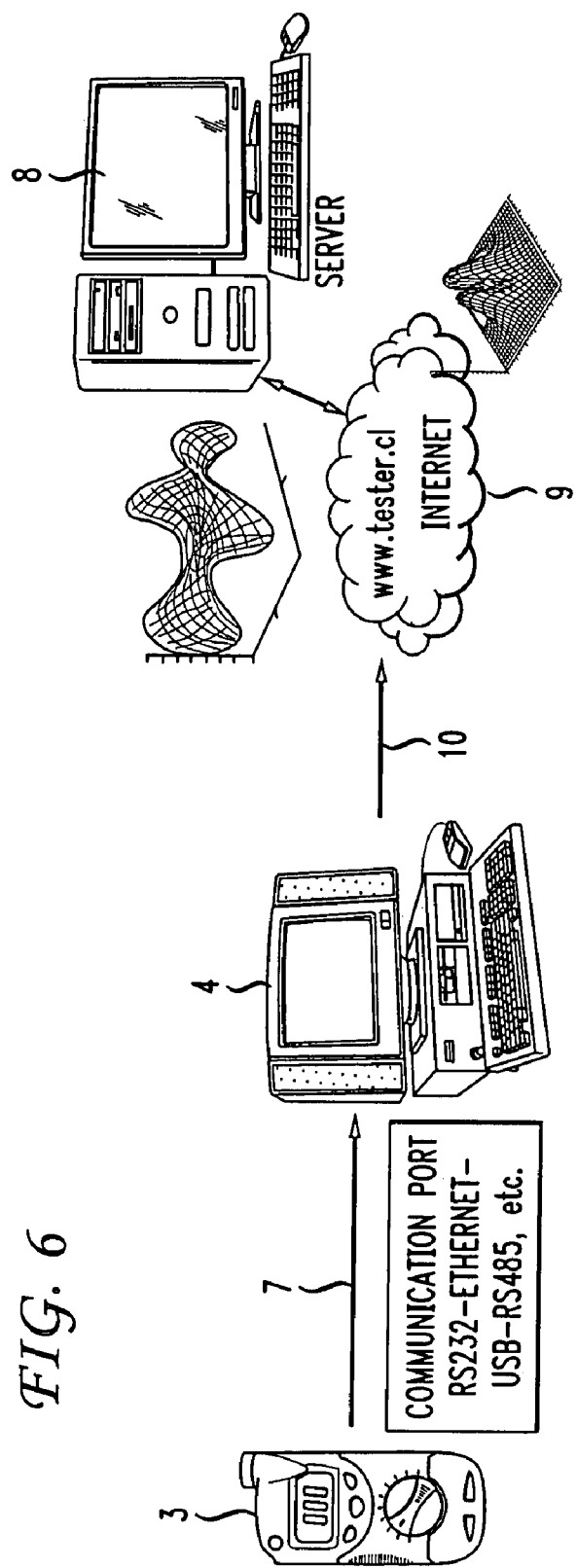
FIG. 6 is an explanatory diagram of the feature which allows the uploading of measured and/or recorded data from a PC to a website in order to perform data analysis using the programs installed on the website.

FIG. 5, shows that an equivalent procedure can be done from Internet. In this case, the computer (4) accesses to the Internet server (8) through the communication port (10). The server sends the requested programs (6), by Internet (9) to the computer (4), which through the port (7), transfers the programs (6) to the measuring instrument (3).

Once the instrument (3) is loaded with the programs (6), is it possible to carry out the measurements at the plant and store them in the multimeter data memory.

After the measurements are carried out, the measuring instrument (3) is re-connected to the computer (4) through the communication port (7), transferring the data to the computer (4), which by means of the communication channel (10) accesses the Internet (9), to reach the server (8) that processes the measured data.

Figure 7:
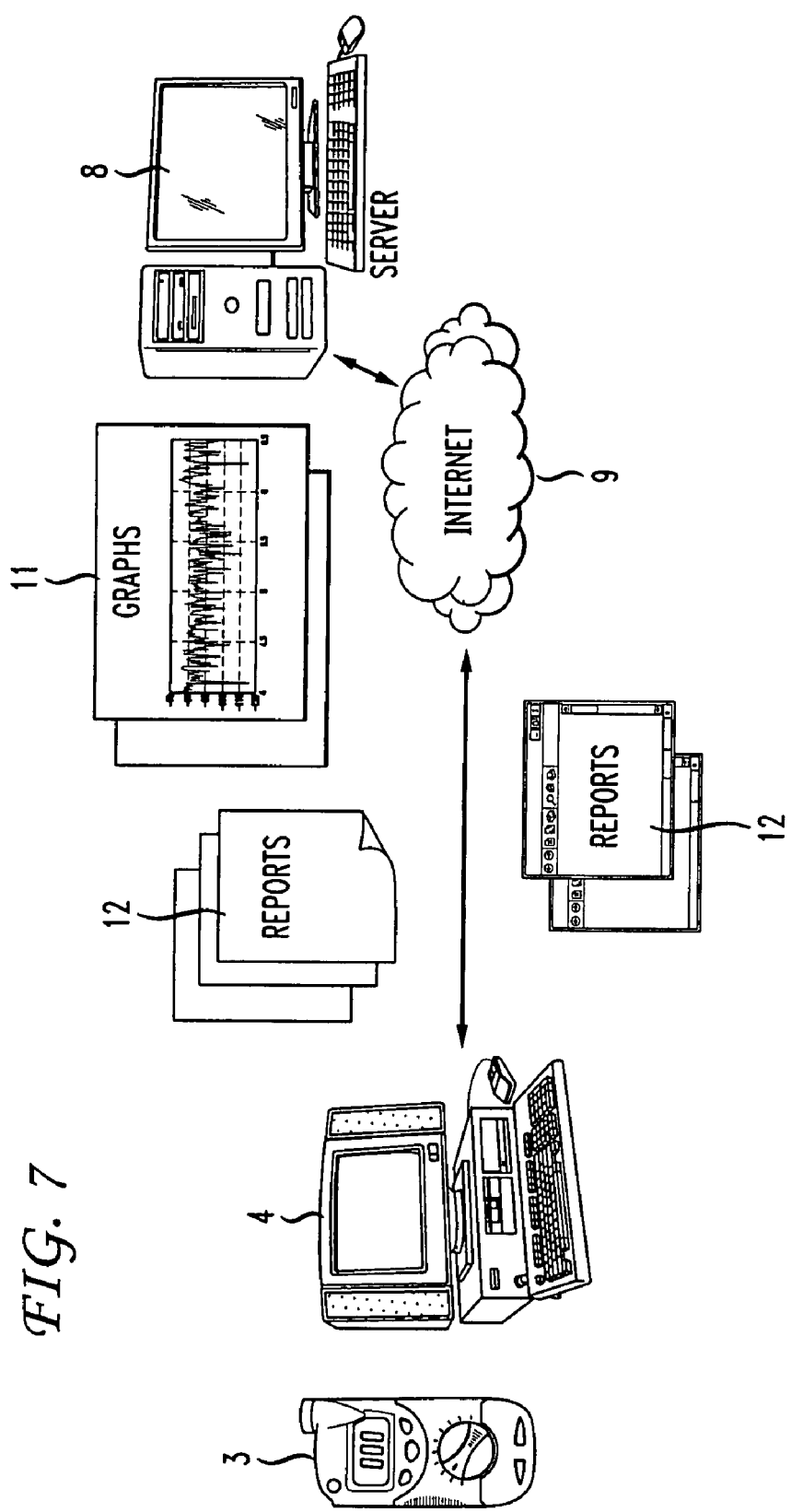
FIG. 7 is an explanatory diagram of the feature which allows the downloading of data from a website, through a PC, in order to obtain the results of the graphical and numerical analyses previously requested.

FIG. 7, shows that the computer (4) through an Internet site (9) has access to a server (8) that has advanced programs to process the data measured by the instrument (3). In the server (8), programs and software of diverse types are executed automatically to generate graphs (11) and reports (12) on the measured data.

Next, from the server (8), using the Internet (9), the graphs (11) and reports (12) are sent to the computer (4) so that the user obtains from these graphs and reports the information necessary to manage his plant.

This example of the application is not limitative, being clear that a person skilled in the art could implement the invention in many forms based on the claims that follow.

The invention claimed is:

1. A method of measuring, processing, and analyzing electrical variables to solve an operational or production problem, wherein said method comprises the steps of:

selecting an electrical variable to measure with a multimeter;

connecting the multimeter to a computer using a communication port available in the computer, through a communication cable;

selecting a measurement functionality from a storage media of the computer or an Internet site storing a plurality of measurement functionalities;

loading the selected measurement functionality from the computer into the multimeter;

configuring specific parameters of the selected measurement functionality using the computer;

disconnecting the multimeter from the computer;

measuring electrical variable data using the multimeter loaded with the selected measurement functionality;

connecting the multimeter to the computer;

transferring the measured electrical variable data from the multimeter to the computer;

transferring the measured electrical variable data from the computer to a server accessible via the Internet;

storing the measured electrical variable data on the server, wherein the stored electrical variable data is made publicly available via the Internet; and executing application software in the server to process the stored data and to generate a first report including a statistical analysis of the stored data, the first report identifying an operational or production problem based on the statistical analysis and identifying a potential solution to the problem.

2. A method according to claim 1, wherein the stored data is processed by graphical processing using one or more programs resident on the server which generate a diagnosis report with a pre-defined format and a set of graphs whose format is defined by a user of the multimeter.

3. A method according to claim 1, wherein the stored data is processed by numerical processing using one or more programs resident on the server which process the data and convert it into new sets of data corresponding to at least one of statistics, correlations, maximums, and minimums to be incorporated into the first report.

4. A method according to claim 1 to validate the first report, comprising the steps of:

measuring the same electrical variable data using the multimeter as in claim 1;

transferring the newly measured electrical variable data from the multimeter to the computer;

transferring the newly measured electrical variable data from the computer to the server;

storing the newly measured electrical variable data on the server, wherein both the stored electrical variable data and the newly stored electrical variable data are made publicly available via a single Internet website;

executing application software in the server to process the newly stored data; and generating, with the application software, a second report and comparing the second report with the first report to validate the one or more applied recommendations.

5. A method according to claim 1, wherein the first report is made publicly available via a published Internet web site.

6. A method according to claim 5, wherein the published Internet web site permits Internet users to post questions related to the analyzing of the measured electrical variable data and to answer questions posted by other Internet users or to post a diagnosis according to their experience.

7. A method according to claim 1, further comprising:

posting a question to the Internet site using the application software in the server, the question related to the identified operational or production problem; and receiving one or more replies from Internet users comprising one or more potential solutions to the problem.

8. A method according to claim 7, further comprising applying one or more of the potential solutions received from the first report or the Internet users to solve the operational or production problem.

9. A method according to claim 1, wherein the operational or production problem includes optimizing the efficient use of electrical energy.

* * * * *